United States Patent
Zhu et al.

(10) Patent No.: US 7,576,357 B1
(45) Date of Patent: Aug. 18, 2009

(54) SYSTEM FOR CHARACTERIZATION OF LOW-K DIELECTRIC MATERIAL DAMAGE

(75) Inventors: Jianhong Zhu, Austin, TX (US); David Wu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 469 days.

(21) Appl. No.: 11/259,572

(22) Filed: Oct. 26, 2005

(51) Int. Cl.
*H01L 23/58* (2006.01)
(52) U.S. Cl. .................. 257/48; 257/E21.524; 324/548
(58) Field of Classification Search .................. 257/48, 257/E21.524, E21.521; 324/548
See application file for complete search history.

(56) References Cited

U.S. PATENT DOCUMENTS 6,787,803 B1* 9/2004 Yao et al. ..................... 257/48

2005/0024077 A1* 2/2005 Huang et al. ................. 324/765
2005/0194649 A1* 9/2005 Oki ............................ 257/409

OTHER PUBLICATIONS

Iacopi, F. et al., "Processing damage and electrical performance of porous dielectrics in narrow spaced interconnects," *Materials, Technology and Reliability for Advanced Interconnects and Low-k Dielectrics—2004*, Symposium held Apr. 13-15, 2004, 8 pages, Materials Research Society, Warrendale, PA.

* cited by examiner

*Primary Examiner*—Jerome Jackson, Jr.
*Assistant Examiner*—Paul A Budd
(74) *Attorney, Agent, or Firm*—Foley & Lardner LLP

(57) ABSTRACT

A method of detecting damage to at least one dielectric layer in an IC die by determining a capacitance factor. The capacitance factor can be used to determine damage in a low-k dielectric material. A system for detecting damage can include a conductive line structure for measuring capacitance and software or a device for determining the capacitance to determine the damage.

20 Claims, 7 Drawing Sheets

SYSTEM FOR CHARACTERIZATION OF LOW-K DIELECTRIC MATERIAL DAMAGE

FIELD OF THE INVENTION

The present application relates to integrated circuits (IC), devices, processes, and fabrication. More particularly, the present application relates to a system for and a method of characterizing dielectric materials on an IC device.

BACKGROUND

As IC devices achieve smaller and smaller geometries, damage to dielectric materials in the metal layers (e.g., interconnect layers) are more likely to have more damaging effects. These damaging effects can include damage to trenches within which conductive lines are situated. As damage occurs to the dielectric material, performance of the semiconductor or IC device can be degraded For example, damage can increase the dielectric constant of the dielectric material, thereby reducing the speed advantages of low-k materials.

Damage can occur to the sidewalls and bottoms of the trench and can affect the dielectric constant (K values) associated with the dielectric material. The damage not only affects the K value of the dielectric material, it also can adversely affect moisture absorption in the dielectric material, can modify the dielectric material or can cause other adverse consequences.

As advanced processing techniques (such as 65 nanometer (nm), 45 (nm) or below processes) are developed, the use of low-k dielectric material is preferred. Low-k dielectric materials (especially porous ultra low-k dielectric materials) can be damaged by plasma and/or ashing treatments associated with various etching and other process steps. Such low-k damage usually occurs on trench sidewalls and the bottom of trenches. In addition, advance processing techniques are etching low-k dielectric materials without the use of an etch stop layer (e.g. silicon nitride ($Si_yN_x$). The lack of an etch stop layer makes the low-k dielectric material even more susceptible to damage during processing techniques (e.g., plasma etching).

An article entitled "Materials, Technology and Reliability for Advanced Interconnects and Low-k Dielectrics" by F. Lacopi, Y. Travaly, M. Stucchil, H. Struyf, S. Peeters, R. Jonckheere, L. H. A. Leunissen, Zs. Tokei, V. Sutcliffe, O. Richard, M. Van Hove and K. Maex, in Mat. Res. Soc. Symp. Proc., (Vol. 812, F1.5, 2004) describes a low-k damage characterization method. The method in the article is used only on structures in a single metal layer with no bottom damage and the method is not capable of dealing with cases having serious bottom damage. The method of the article also does not have the advantage of minimizing the influence of K values in surrounding dielectrics on the final results. Accordingly, there is a need for an improved system for and an improved method of characterizing damage to low-k dielectric materials.

There is also need for a system of and a method for characterizing low-k dielectric material damage to a trench bottom or trench sidewall. Yet further still, there is a need for a low-k dielectric material characterization method that provides easy to obtain statistical results, is accurate and has increased sensitivity to smaller feature sizes. Yet further, there is a need for a semiconductor device qualification method using an improved dielectric material characterization technique. Further, there is a need for a method of qualifying interconnects (which include metal lines and surrounding dielectrics) which may be degraded by damage to dielectrics.

It would be desirable to provide a system and/or method that provides one or more of these or other advantageous features. Other features and advantages will be made apparent from the present specification. The teachings disclosed extend to those embodiments which fall within the scope of the appended claims, regardless of whether they accomplish one or more of the above-mentioned needs.

SUMMARY

An exemplary embodiment relates to an IC die. The IC die includes a substrate, a first metal layer, and a second metal layer. The first metal layer is above the substrate. The first metal layer includes a first conductive pattern. The first conductive pattern has lines separated by a first sized space. The first metal layer also includes a second conductive pattern having lines separated by a second sized space. The first conductive pattern and the second conductive pattern are used to characterize damage to a dielectric material associated with the metal layer. The second metal layer is deposited above the substrate. The second metal layer includes a third conductive pattern. The third conductive pattern has lines separated by the first sized space. The second metal layer also includes a fourth conductive pattern having lines separated by the second sized space. The third conductive pattern and the fourth conductive pattern being used to characterize damage to a dielectric material associated with the second metal layer. The two metal layers have different layer thicknesses.

Another exemplary embodiment relates to a system for detecting damage to at least one dielectric material in an IC die. The system includes first conductive line means, second conductive line means, and means for determining. The first conductive line means is provided in at least one layer for providing a set of structures to measure capacitances. The second conductive line means is provided in at least one other layer for providing a second set of structures to measure capacitances. The means for determining determines the capacitances to detect the damage.

Another exemplary embodiment relates to a method of detecting damage to dielectric material in at least one conductive layer in an IC die. The method includes providing electrical potential to a first conductive line pattern associated with the one conductive layer, providing an electrical potential to a second conductive pattern associated with another conductive layer and determining a capacitance factor for the first conductive line pattern and the second conductive line pattern.

BRIEF DESCRIPTION OF THE DRAWINGS

The invention will become more fully understood from the following detailed description, taken in conjunction with the accompanying drawings, wherein like reference numerals refer to like elements, in which.

DETAILED DESCRIPTION OF EXEMPLARY EMBODIMENTS

Figure 1:
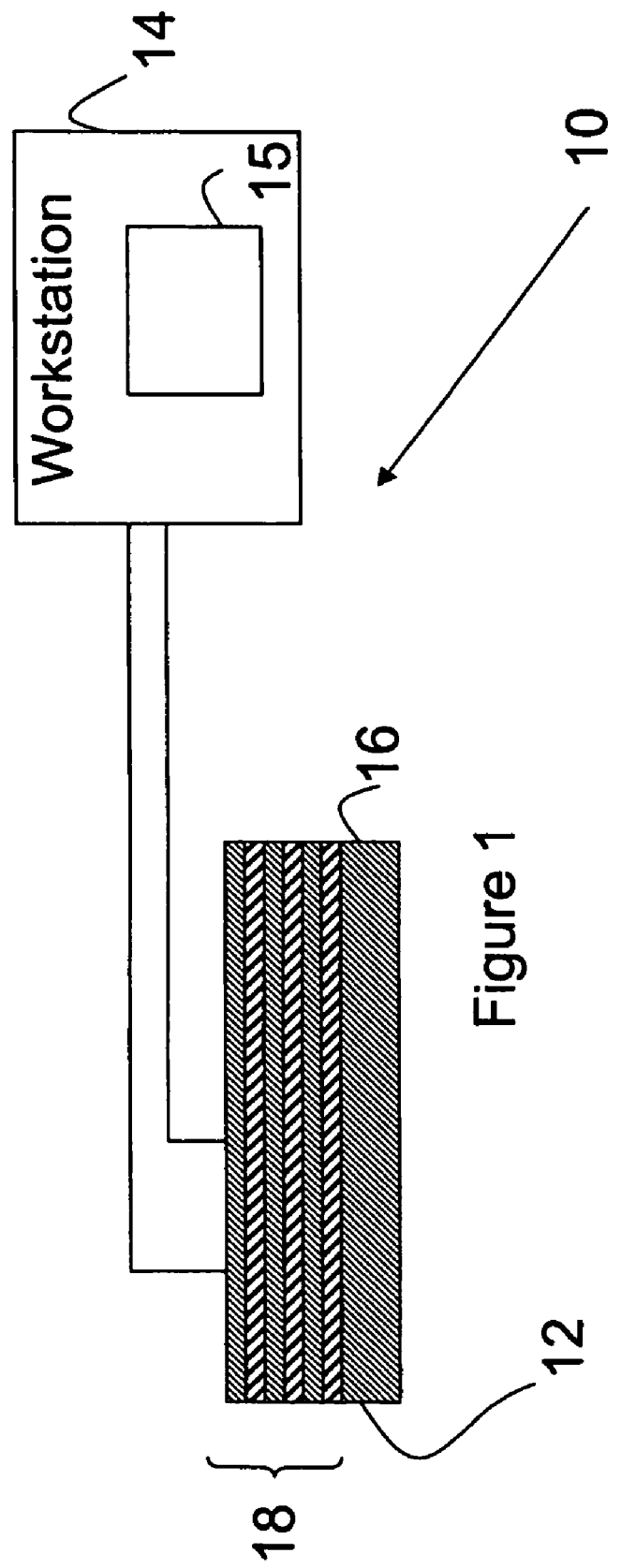
FIG. 1 is an exemplary general block diagram of a system configured to test at least one characteristic of a dielectric material in an IC device.

Referring to FIG. 1, a system 10 includes an IC device 12 and a workstation 14. Workstation 14 is coupled to IC device 12 and can be utilized to characterize dielectric material associated with IC device 12.

In one embodiment, workstation 14 can be coupled to device 12 via a JTAG interface and measure capacitance to advantageously determine the extent of damage to dielectric material in IC device 12. Work station 14 can alternatively be an IC testing device and can be coupled to IC device 12 and/or metal layers 18 via other coupling devices, test probes, etc.

IC device 12 preferably includes a substrate 16 which can be any suitable IC device substrate and a number of metal layers 18. Device 12 can be packaged, unpackaged, a complete functional device, a partially completed device, or a device at any stage in the fabrication process. Device 12 preferably includes one or more metal layers 18. According to another alternative, device 12 can be a wafer or a chip.

IC device 12 can include any number of metal layers 18 (e.g., 1, 2, 3, 4, 5, 6, 7 or more). Although system 10 is described with respect to measuring damage to dielectric layers in metal layers 18, system 10 can be configured to measure damage to other dielectric structures associated with IC device 12.

In one exemplary embodiment, interconnect layers or metal layers 18 are preferably copper layers including trenches within which copper conductive lines are provided. The trenches are formed in a dielectric material (preferably a low-k dielectric material).

Advantageously, workstation 14 or other testing circuitry provides electric power (current or potential difference, or both) to device 12 to determine an electronic parameter associated with at least a portion of metal layers 18. Workstation 12 utilizes information known about conductive lines in metal layers 18 and electronic parameters to determine the amount of damage to dielectric material in at least one of metal layers 18.

In one preferred embodiment, workstation 14 can measure capacitance associated with certain conductive lines across a spectrum of line spaces and/or line heights or both. Capacitance can be measured by determining the RC time constant associated with the conductive lines, by measuring impedance of the conductive lines, or any other technique. Workstation 14 compares such measurements of capacitance to characterize the amount of damage in the dielectric material as described in more detail below. The damage can be associated with a sidewall and/or bottom of a trench in the dielectric material.

System 10 can include circuitry for making capacitive measurements integrated on IC device 12 and eliminate a need for workstation 14 or other testing device. Preferably, graphical representations of the characterizations can be provided on a display of workstation 14. Tests on the dielectric material can be performed on sample die to assist in determining the accuracy of certain process steps or as device 12 is completed to qualify the device or process.

In one embodiment, workstation 14 can include a database 15 for storing capacitive measurements associated with metal layers 18. Workstation 14 can perform historical analysis of capacitive measurements to determine variations in capacitance associated with layers 18. In addition, workstation 15 can convert capacitance measurements into a measurement of damage associated with layers 18 and store such historical data.

Figure 2:
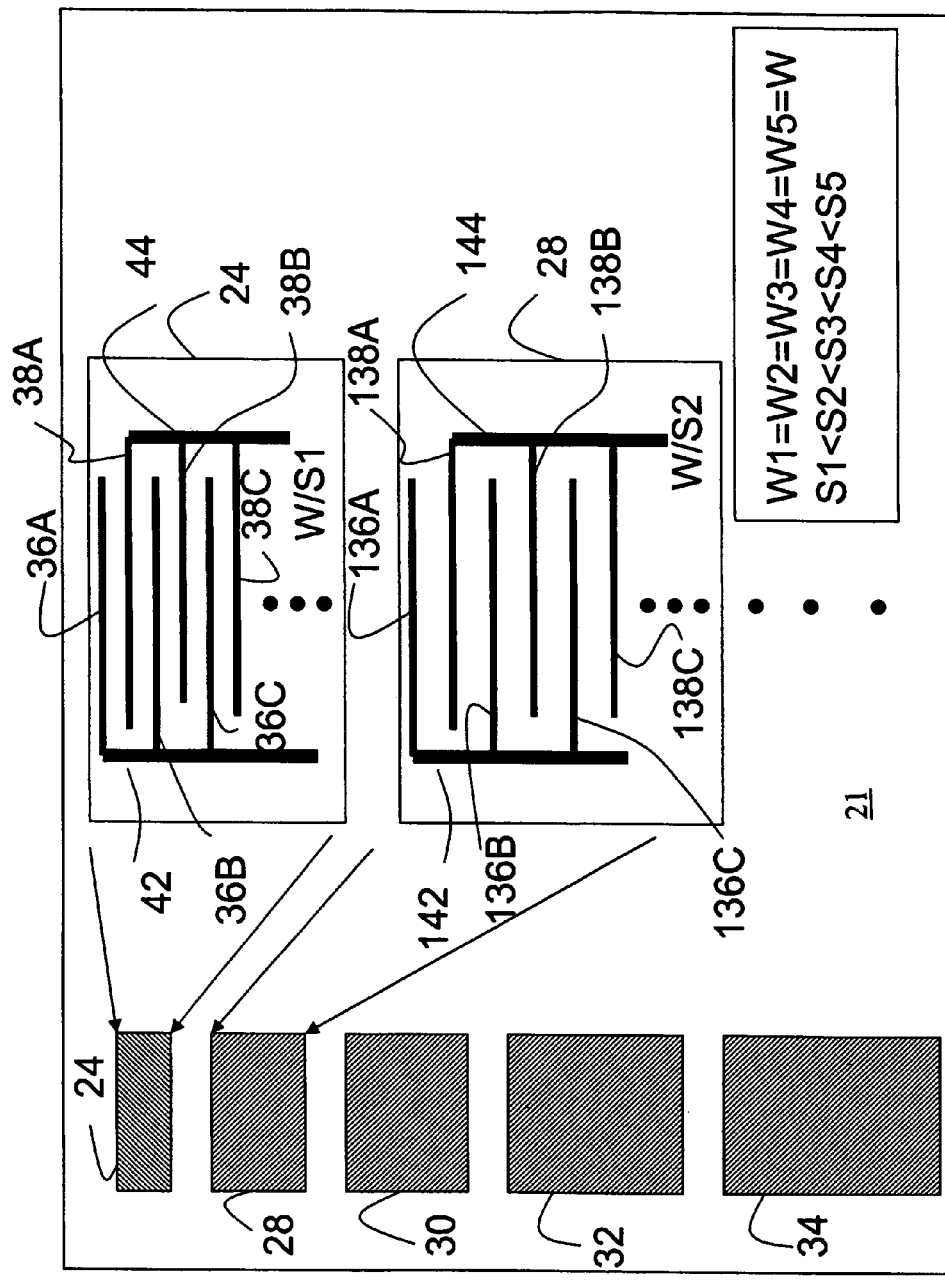
FIG. 2 is a graphical representation of several similar patterns on one active metal layer of the IC device illustrated in FIG. 1 in accordance with an exemplary embodiment.
Figure 3:
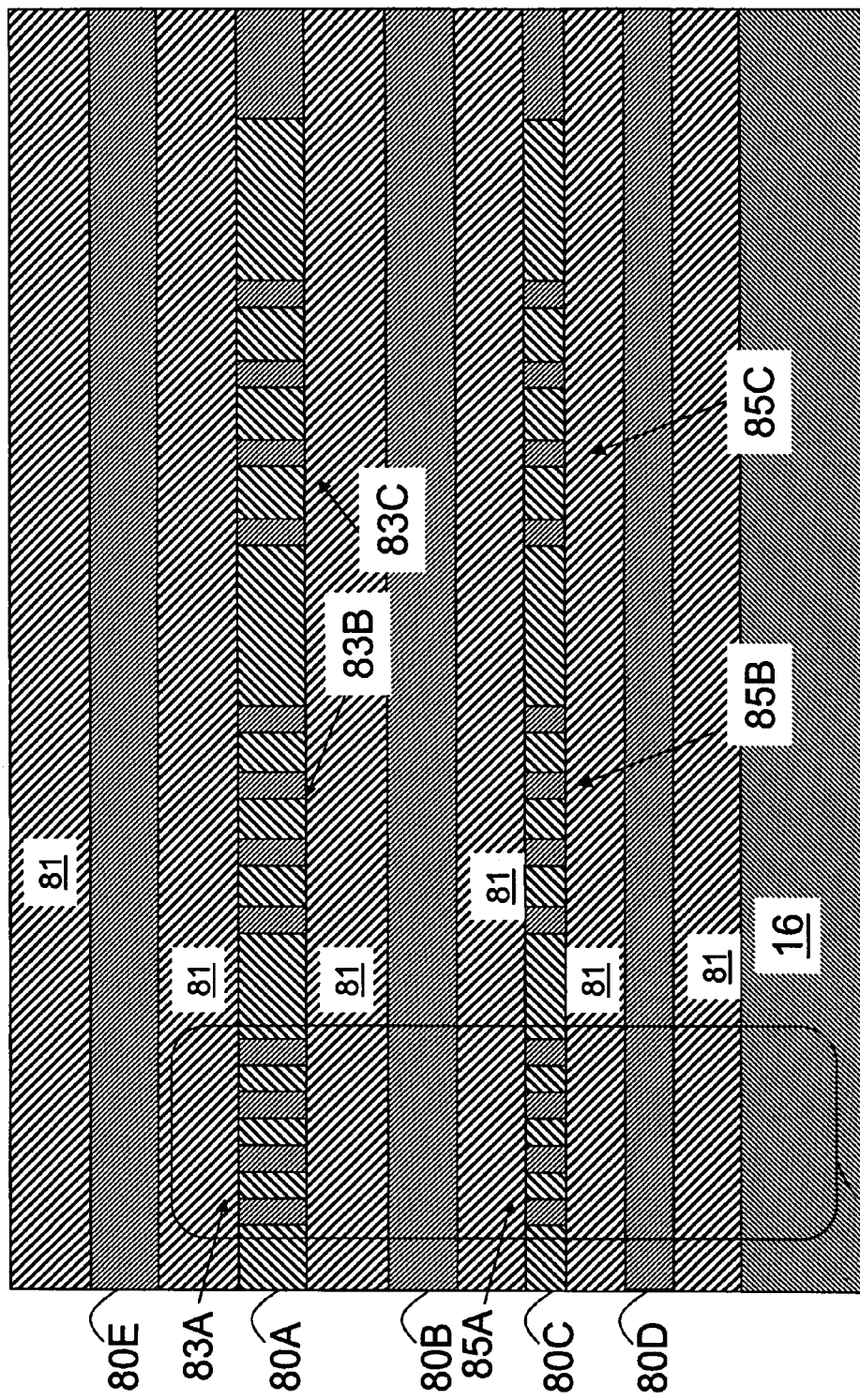
FIG. 3 is a more detailed cross sectional view schematic drawing of a metal layer for the IC device illustrated in FIG. 1 in accordance with another exemplary embodiment.

With reference to FIG. 2, IC device 12 preferably includes several similar patterns (24, 28, 30, 32, 34) (with same metal line width (w) but different metal spaces S1, S2, S3, S4, S5, and Sn) on one metal layer 21 (such as one of layers 80A or 80C in FIG. 3). Substantially similar patterns 24, 28, 30, 32, and 34 are disposed on a second metal layer (not shown) with preferably the only difference being in metal layer thickness.

As shown in FIG. 2, device 12 includes pattern 24 and pattern 28 on a same layer (layer 21). In one embodiment, patterns 24 and 28 (on a same metal layer) are between two planar conductive layers.

Advantageously, system 10 can utilize a unique method to characterize the low-k damage thicknesses both on the trench sidewalls and the trench bottom associated with a metal layer. System 10 and device 12 are preferably designed so that the influence of the K values and surrounding dielectrics on the final results is minimized.

In one preferred embodiment, conductive pattern 24 includes a number of conductive lines 36A-C and 38A-C. The number of conductive lines 36A-C can be 1, 2, 3, 4, 5, 6 or 7 or more. Conductive lines 36A-C are arranged in pairs with conductive lines 38A-C. Conductive lines 38A-C are not physically coupled to lines 36A-C.

Conductive pattern 28 includes a number of conductive lines 136A-C and 138A-C. The number of conductive lines 136A-C can be 1, 2, 3, 4, 5, 6, or 7 or more. Conductive lines 136A-C are arranged in pairs with conductive lines 138A-C in a pattern similar to conductive pattern 24. Conductive lines 138A-C are not physically coupled to conductive lines 136A-C.

Accordingly to one preferred embodiment, the space between conductive lines 36A-C and 38A-C, respectively, is a fixed distance, (e.g., S1). Similarly, the distance between conductive lines 136A-C and 138A-C is a different fixed distance (e.g., S2).

In one embodiment, patterns 24 and 28 are of inter-digitated comb copper lines with a same metal width but with different spaces on a same Cu/low-k interconnect layer (e.g., layer 21). Although inter-digitated comb patterns are shown in FIG. 2, other patterns are possible including S-shaped patterns, square patterns, rectangular patterns, etc., for lines 36A-C and 38A-C. Further, conductive lines 36A-C and 38A-C can be fabricated from any material.

According to another embodiment, pattern 28 has an identical or nearly identical pattern to that of pattern 24, the main difference being that pattern 28 has a different sized space.

With reference to FIG. 3, IC device 12 includes conductive layers 80A-D above substrate 16. Each of layers 80A-D is separated from each other by a dielectric layer 81. Conductive layers 80A and 80C include patterns 83A-C and 85A-C, respectively, which are same as the patterns in FIG. 2 but with different metal heights. The use of different line heights advantageously allows the determination of the bottom trench damage b as explained below.

Figure 4:
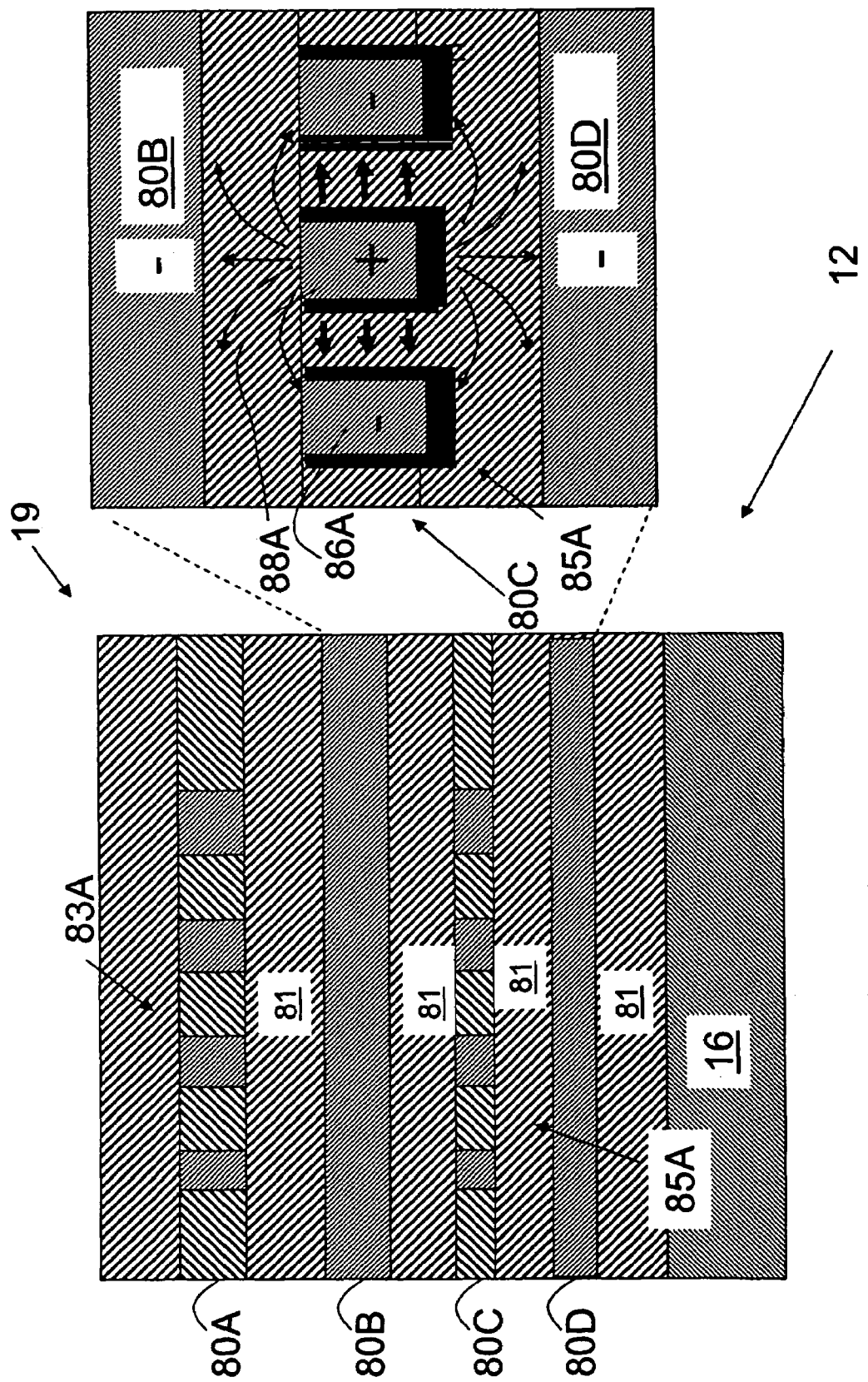
FIG. 4 is a more detailed cross sectional view schematic drawing of a portion of the metal layer illustrated in FIG. 3.

With reference to FIG. 4, capacitance between fingers in layer 80C includes several components. Intermetal dielectric capacitance ($C_{IMD}$ directly through the side wall of trenches) is indicated by bold black arrows. Fringing capacitance $C_{fringing}$ is represented by thin arrows between fingers, and capacitance to neighboring layers $C_{bottom}$ is represented by thin arrows to layers 80D and 80B.

In one preferred embodiment, layers 80B and 80D are planer above the conductive pattern associated with layer 80C. In another embodiment, layers 80B and 80d include conductive lines perpendicular to the lines of patterns 83A and 85A. The various drawings of conductive patterns in this application are not drawn to scale.

In a preferred embodiment, pattern 85A of layer 80C has interdigitated copper fingers or conductive lines that are coupled so that a capacitance between conductive lines can be measured. Each of the conductive lines has the same width (W) and are separated by a distance of S1. Conductive lines in layer 80A (pattern 83A) are preferably separated by a same distance of S1 and have the same width as lines 85A and 85B in layer 80C.

With reference to FIG. 3, patterns 83B and 85B have interdigitated copper fingers or conductive lines that are coupled so that a capacitance between conductive lines can be measured. Each of the conductive lines has the same width (W) and are separated by a distance of S2. The distance S2 is different than the distance S1. Patterns 83C and 85C have interdigitated copper fingers or conductive lines that are coupled so that a capacitance between conductive lines can be measured. Each of the conductive lines has the same width (W) and are separated by a distance of S3. The distance S3 is different than the distances S1 and S2. The height of the conductive fingers in layer 80C is different (e.g., less) than the height of the conductive lines in layer 80A.

Figure 5:
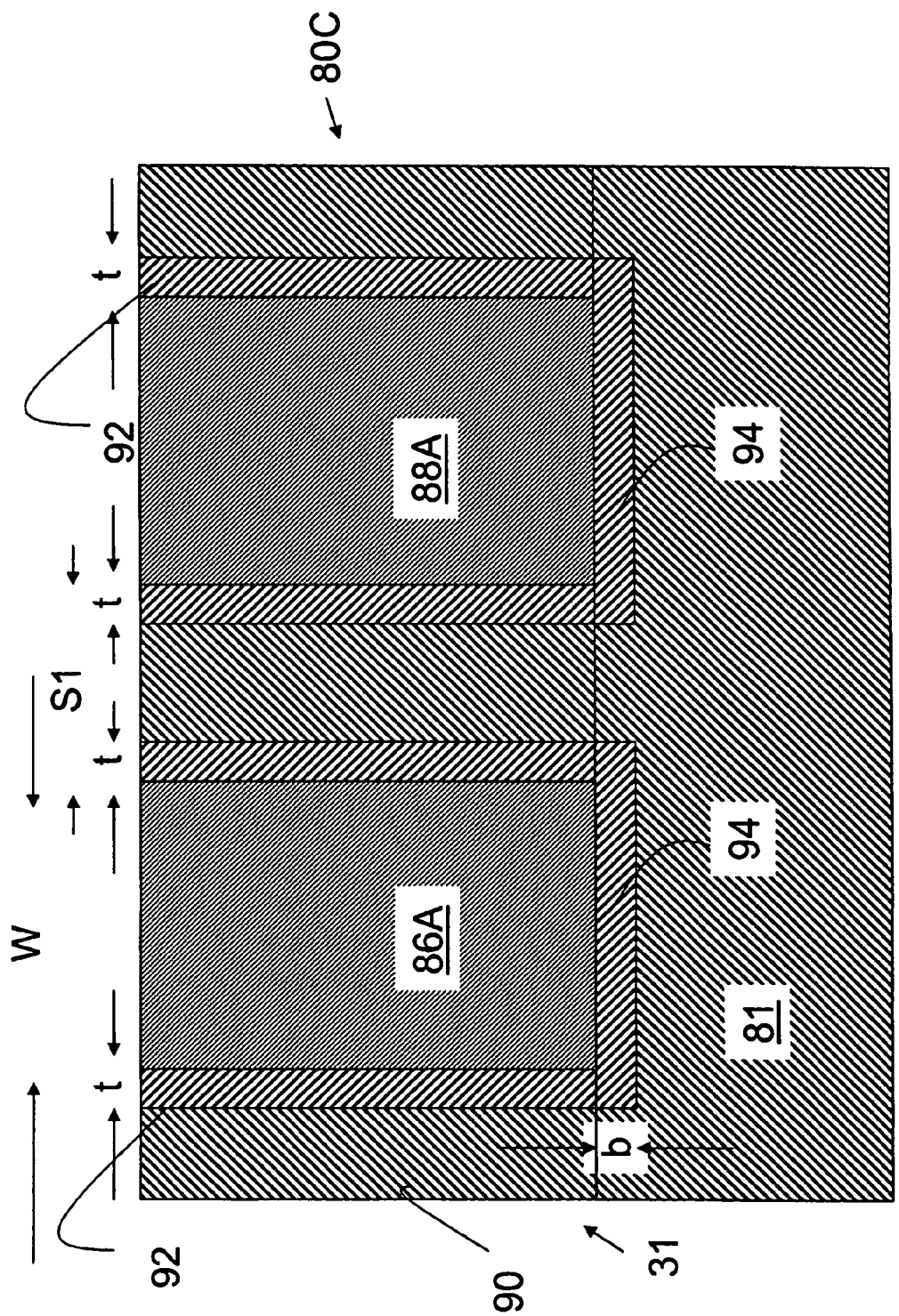
FIG. 5 is a more detailed schematic cross sectional view drawing of a portion of the metal layer illustrated in FIG. 4.

With reference to FIG. 5, a portion 31 of layer 80C includes conductive lines 86A and 88A. Conductive lines 86A and 88A have a width of W and are provided in trenches with a width of W. Lines 86A and 88A are separated by a distance of S1.

Dielectric material 90 in layer 80C and dielectric material 94 which are preferably porous low-k dielectric materials can undergo damage during processing. Damaged regions include damaged side wall regions 92 and damaged bottom regions 94. Damaged regions 92 have a thickness of t. Damaged bottom regions have a thickness of b. Usually b>t because of straight impinging of ions. The distance across undamaged dielectric material 90 between conductors 86A and 88A is S1–2t.

Table 1 below provides exemplary dimensions for patterns 83A-C and 85A-C. The dimensions below are not disclosed in a limiting fashion unless specifically recited in the claims.

TABLE I

Exemplary dimensions for conductive lines 36A-C and 38A-2C

| Pattern | Line Width (nm) | Line Height (nm) | Line Spacing between respective pair (nm) |
|---|---|---|---|
| 83A | 100 | 250 | S1 = 90 |
| 83B | 100 | 250 | S2 = 120 |
| 83C | 100 | 250 | S3 = 150 |
| 85A | 100 | 200 | S1 = 90 |
| 85B | 100 | 200 | S2 = 120 |
| 85C | 100 | 200 | S3 = 150 |

Figure 6:
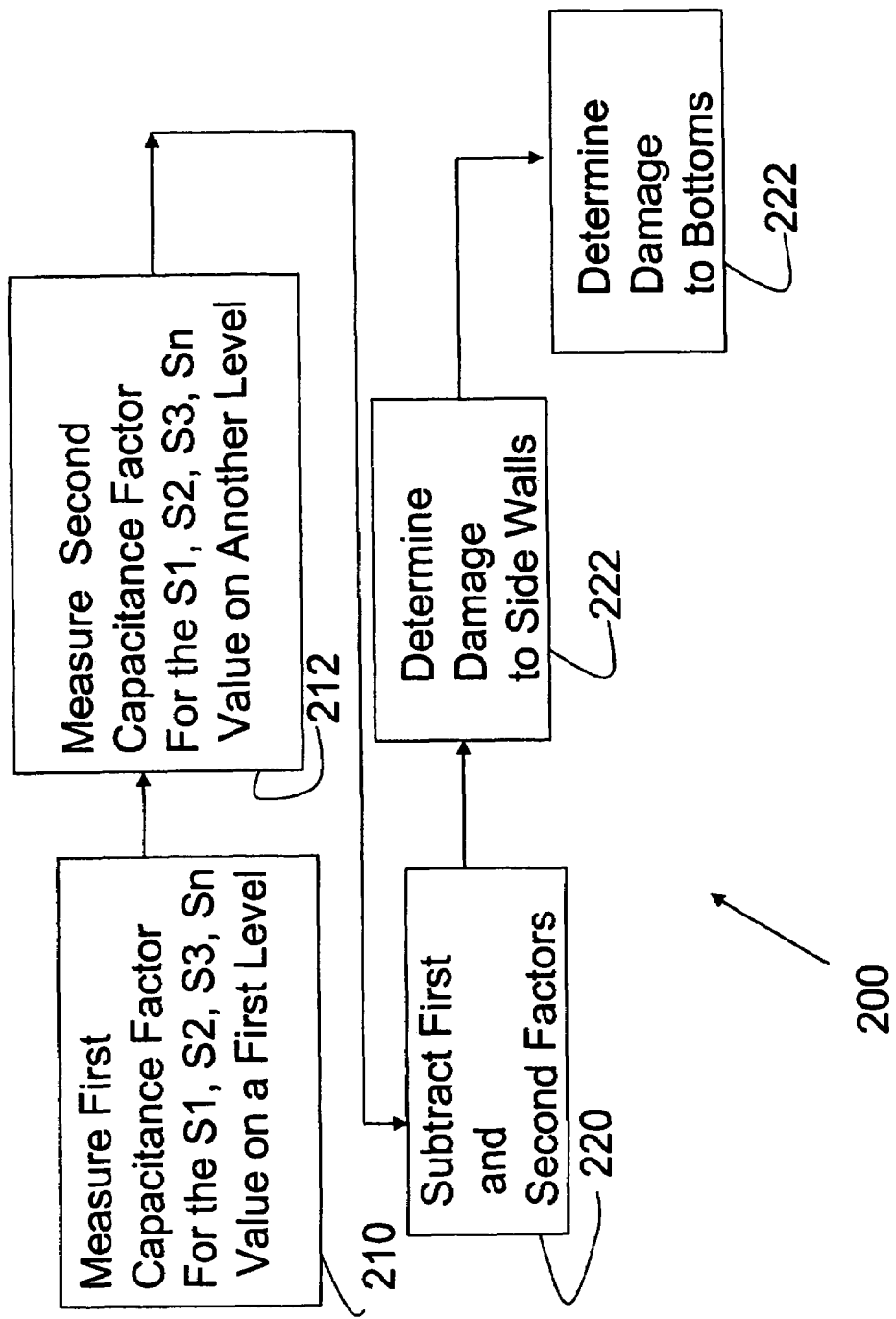
FIG. 6 is a flow chart showing the operation of the system illustrated in FIG. 1 in accordance with yet another exemplary embodiment.

The operation of system 10 is described below with reference to FIGS. 1-6. In FIG. 6, flow chart 200 shows exemplary steps. The steps can be performed in a different order from the order that is shown.

At a step 210, a first factor is determined for the patterns 83A-C associated with values S1, S2, and S3, respectively. At a step 212, a second factor is determined for patterns 85A-C associated with values S1, S2 and S3, respectively.

The first and second factors are preferably determined by measurement and are capacitance factors. The first and second factors can be determined by applying an electrical potential to patterns 83A-C and 85A-C. The capacitance factor is each equal to the total coupling capacitance which is equal to $C_{IMD}$ (bold arrows in FIG. 4) plus the fringing capacitance (thin arrows) ($C_{IMD}+C_{fringing}$).

Determining capacitance factors across a number of different sized spaces provides data for effectively determining the amount of damage dielectric material (e.g., the thickness t). At a step 220, the first and second capacitance factors are subtracted. Preferably, the first and second capacitance factors are subtracted according to the spacing between respective pairs (e.g., capacitance factor for S1 on a first level minus capacitance factor for S1 on a second level, capacitance factor for S2 for the first level minus capacitance factor S2 for the second level, etc.). The subtraction of the first and second capacitance factors provides data related to the difference in each level ($\Delta C_{IMD}$) because of difference in height for each sized space (assuming that the fringing capacitance and capacitance to neighboring layers is approximately equal). Applicants believe that this assumption is valid because the patterns in the two layers are same (for each same S) except for their heights, and dielectric between the active layers and their shielding layers are same regarding dielectric constants and thicknesses. Bottom damage is believed to have little dependence on trench depth, so $\Delta C_{IMD}$ is separated from bottom damage effect. Trench side wall damage is believed to have little dependence on metal line space so patterns with different spaces have a same sidewall damage width t.

Preferably, the t is determined according to the following calculation:

$$1/\Delta C_{IMD} = S/(Kk_0 \Delta H) + 2t(1(K_d k_0 \Delta H) - 1/(Kk_0 \Delta H)) \text{ per unit area;}$$

where $\Delta C_{IMD}$ is the difference in intermetal dielectric capacitance (between the structure in the two layers) (bold arrows) per unit length per Cu—Cu pair;

$K_d$ is the dielectric constant of damaged dielectric material and is assumed to be 4.2 (same as that for SiO2) in the case of SiCOH low k material;

$k_0 = 8.85E-12$ F m$^{-1}$ is the electric constant;

$\Delta H$ is the Cu line height difference between 83A and 85A;

K is the dielectric constant of undamaged dielectric material;

S is the space between the conductive lines (e.g., S1, S2, S3, S4, etc.);

and t is the thickness of the damaged area per side.

Figure 7:
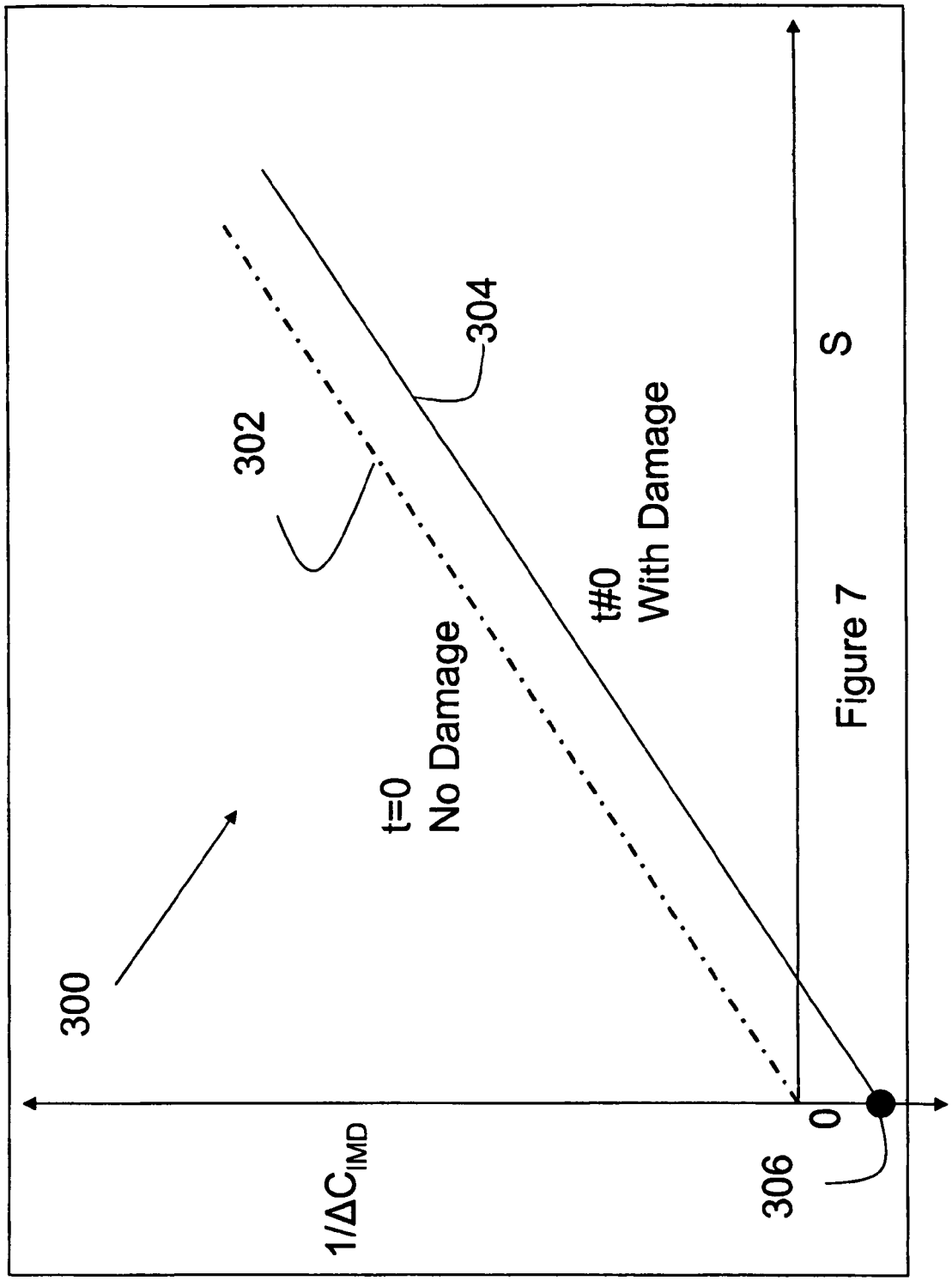
FIG. 7 is an exemplary graphical representation of the relationship between the distance between lines in the metal layer illustrated in FIG. 3 and the inverse of capacitance.

In one embodiment, a graph such as graph 300 in FIG. 7 can have $1/\Delta C_{IMD}$ per unit length on a Y axis and S on an X axis to determine t according to step 215. A first line 302 shows a graph where t=0 and there is no damage. Line 302 generally has a slope of 1/K. A second line 304 shows t not equal to zero (e.g., damage to the dielectric material). t can be determined by analysis of the intersect of line 304 with the Y axis. A point 306 indicates the intersection of the Y axis and is used for determining t. Various mathematical and graphical analysis can be utilized to determine t given values of $\Delta C_{IMD}$ corresponding to values of S1, S2, etc. Line 304 is plotted using the data from step 220.

In addition, system 10 can determine damage at the bottom of the trench, according to flow chart 200. At a step 222, damage at the bottom is determined.

After determining trench sidewall damage, low k trench bottom damage can be extracted. Assuming dielectric constant in the damaged region to be 4.2 (same as that of SiO2) in the case of SiCOH low k (most of the low k materials available have such kind of composition). The bottom damage thickness is the only parameter that is undetermined. This thickness can be determined by comparing capacitance simulation (with damage consideration included) with measurement data (coupling capacitance and bottom plate capacitance). The simulation can be done using a field solver software tool such as Raphael.

Preferably, the structures of FIG. 2, 3, 4, or 5 are utilized to determine damage and capacitance values. Alternative structures can also be utilized. Different structures may require adjustments to the equations described above.

While the detailed drawings, specific examples and particular formulations given describe preferred and exemplary embodiments, they serve the purpose of illustration only. The inventions disclosed are not limited to the specific forms shown. For example, the methods may be performed in any of a variety of sequence of steps. The hardware configurations and algorithms shown and described may differ depending on the chosen performance characteristics of the processes. The systems and methods depicted and described are not limited to the precise details and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. A system for detecting damage to at least one dielectric material, the system comprising:
   an IC die comprising:
     a substrate;
     a first metal layer above the substrate, the first metal layer including a first set of conductive patterns, the first set of conductive patterns having a first sized metal height and different metal line spaces for each pattern; and
     a second metal layer above the substrate, the second metal layer including a second set of conductive patterns, the second set of conductive patterns being substantially similar to the first set of conductive patterns, the second set of conductive patterns having a second sized metal height, wherein the second set of conductive patterns is the same as the first set of conductive patterns except for metal height; and
   a capacitive sensor for determining a first capacitance associated with the first set of conductive patterns and a second capacitance associated with the second set of conductive patterns, wherein the first capacitance and the second capacitance are compared to characterize trench sidewall and bottom damage.

2. The system of claim 1, wherein each of the patterns is an interdigitated comb pattern.

3. The system of claim 2, wherein the first set of conductive patterns has a first pattern and a second pattern, wherein the first pattern and the second pattern are substantially similar patterns with a same metal line width, but the spacing between metal lines in the second pattern is greater than the spacing between metal lines in the first pattern.

4. The system of claim 1, wherein each of the conductive patterns is a copper pattern.

5. The system of claim 4, wherein the copper pattern is formed in trenches in a dielectric layer.

6. The system of claim 1, wherein the dielectric layer is a low-k dielectric layer.

7. The system of claim 1, further comprising:
   a dielectric layer above the substrate and directly below the first metal layer; and
   a third metal layer above the substrate and directly below the dielectric layer;
   wherein the capacitance sensor determines a third capacitance between the third metal layer and the first set of conductive patterns in the first metal layer, wherein the third capacitance is used to characterize trench side wall and bottom damage.

8. A system for detecting trench sidewall and bottom damage to at least one dielectric material, the system comprising:
   an IC Die comprising:
     a substrate
     a first metal layer above the substrate, the first metal layer including a first set of conductive patterns, the first set of conductive patterns having a first sized metal height and different metal line spaces for each pattern; and
     a second metal layer above the substrate, the second metal layer including a second set of conductive patterns, the second set of conductive patterns being substantially similar to the first set of conductive patterns, the second set of conductive patterns having a second sized metal height, wherein the second set of conductive patterns is the same as the first set of conductive patterns except for metal height; and
   a capacitive circuit for determining a capacitance associated with the first and second sets of conductive patterns to determine the trench sidewall and bottom damage by providing an electric potential to a first set of conductive patterns, providing an electric potential to the second set of conductive patterns, wherein the determined capacitance is used to characterize the trench sidewall and bottom damage.

9. The system of claim 8, wherein the capacitive circuit determines a difference between the capacitance of the first and second sets of conductive patterns by subtracting a second capacitance factor from a first capacitance factor.

10. The system of claim 9, wherein subtracting further comprises subtracting a first sized space factor associated with the first set of conductive patterns from the first sized space factor from the second set of conductive patterns.

11. The system of claim 8, wherein the second set of conductive patterns has a different line height from the first set of conductive patterns and damage to the bottom of trenches is determined.

12. The system of claim 8, further comprises a JTAG interface.

13. The system of claim 8, wherein the dielectric material is a low-k dielectric material.

14. A system for detecting damage to at least one dielectric material, the system comprising:
   an IC die comprising:
     a substrate;
     a first metal layer above the substrate, the first metal layer including a first set of conductive patterns, the first set of conductive patterns having a first sized metal height and different metal line spaces for each pattern; and
     a second metal layer above the substrate, the second metal layer including a second set of conductive patterns, the second set of conductive patterns being substantially similar to the first set of conductive patterns, the second set of conductive patterns having a second sized metal height; and
   a capacitive sensor for determining a first capacitance associated with the first set of conductive patterns and a second capacitance associated with the second set of conductive patterns, wherein the first capacitance and the second capacitance are compared to characterize trench sidewall and bottom damage, wherein the first set of conductive patterns has a first pattern and a second pattern, wherein the first pattern and the second pattern are substantially similar patterns with a same metal line width, but the spacing between metal lines in the second pattern is greater than the spacing between metal lines in the first pattern.

15. The system of claim 14, wherein the first sized metal height and the second sized metal height are different.

16. The system of claim 14, wherein each of the patterns is an interdigitated comb pattern.

17. The system of claim 14, wherein each of the conductive patterns is a copper pattern.

18. The system of claim 14, wherein the capacitive circuit determines a difference between the capacitance of the first and second sets of conductive patterns by subtracting a second capacitance factor from a first capacitance factor.

19. The system of claim 18, wherein subtracting further comprises subtracting a first sized space factor associated with the first set of conductive patterns from the first sized space factor from the second set of conductive patterns.

20. The system of claim 14, wherein the dielectric material is a low-k dielectric material.

* * * * *